(12) United States Patent
Yoon

(10) Patent No.: US 6,340,636 B1
(45) Date of Patent: Jan. 22, 2002

(54) METHOD FOR FORMING METAL LINE IN SEMICONDUCTOR DEVICE

(75) Inventor: Jin Young Yoon, Seoul (KR)

(73) Assignee: Hyundai Microelectronics Co., Ltd., Chungcheongbuk (KR)

( * ) Notice: Subject to any disclaimer, the term of this patent is extended or adjusted under 35 U.S.C. 154(b) by 0 days.

(21) Appl. No.: 09/429,560

(22) Filed: Oct. 28, 1999

(30) Foreign Application Priority Data

Oct. 29, 1998 (KR) ............................................ 98/45924

(51) Int. Cl.⁷ ................................................ H01L 21/44
(52) U.S. Cl. ...................... 438/672; 438/624; 438/637; 438/633; 438/626
(58) Field of Search ................................ 438/672, 626, 438/624, 623, 637–640, 692, 700, 633

(56) References Cited

U.S. PATENT DOCUMENTS 4,789,648 A    12/1988  Chow et al. ................. 437/225
5,518,963 A *  5/1996   Park .............................. 438/624
5,578,523 A    11/1996  Fiordalice et al. ........... 437/190
5,821,164 A *  10/1998  Kim et al. ................... 438/633

\* cited by examiner

*Primary Examiner*—Charles Bowers
*Assistant Examiner*—Thanh Nguyen
(74) *Attorney, Agent, or Firm*—Morgan, Lewis & Bockius LLP

(57) ABSTRACT

A method for forming a metal line in a semiconductor device, in which a resolution is improved for securing a design rule and minimizing a difference of critical dimensions, including the steps of (1) forming a first insulating film and a second insulating film on a substrate, (2) etching the second insulating film to form a second insulating film pattern, (3) depositing a third insulating film on the second insulating film pattern, (4) removing the second insulating film pattern, and (5) forming a metal line layer in a region having the second insulating film pattern removed therefrom.

9 Claims, 7 Drawing Sheets

FIG.4b

| | positive tone pattern form | negative tone pattern form |
|---|---|---|
| Critical dimension to be limitation of resolution | ⊙ Line/Space 0.17μm/0.17μm<br>⊙ Isolated Line 0.17μm | ⊙ Line/Space 0.17μm/0.17μm<br>⊙ Isolated space 0.21μm |
| difference of critical dimension concentrated region— isolated region | <0.02μm | <0.05μm |

METHOD FOR FORMING METAL LINE IN SEMICONDUCTOR DEVICE

BACKGROUND OF THE INVENTION

1. Field of the Invention

The present invention relates to a semiconductor device, and more particularly, to a method for forming a metal line in a semiconductor device.

2. Background of the Related Art

Referring to FIG. 1a, in a related art method for forming a metal line, a metal layer 2 of aluminum is deposited on an oxide film 1, and a positive photoresist 3 is coated on the metal layer 2, and subjected to selective patterning by exposure and development using a dark tone mask so that the positive photoresist 3 masks a portion in which a metal line is to be formed. Then, as shown in FIG. 1b, the patterned resist 3 is used as a mask in etching the metal layer 2, to form a plurality of metal lines 2a. Thereafter, the photoresist 3 is removed and the same process is repeated to form multi-layered metal lines.

However, due to limitations in electrical properties of aluminum used for the metal line, copper has been used for a material of the metal. line. It is difficult to form a metal line of copper by a general method for forming a metal line due to a poor etchability of copper. Because of this reason, a process is employed in which an interlayer material is deposited firstly before formation of a metal line layer, a portion of the interlayer material in which the metal line layer is to be formed is etched, and a metal is stuffed in the etched portion, and planarized, which process is called a dual damascene process.

A related art method for forming a metal line by a dual damascene process will be explained with reference to the attached drawings. FIGS. 2a~2d illustrate sections showing the steps of a related art method for forming a metal line in a semiconductor device.

Referring to FIG. 2a, a second oxide film 12 is deposited on a first oxide film 11 having a via hole and a trench formed therein and a photoresist film 13 is coated on the second oxide film 12. Then, the photoresist film 13 is removed by exposure and development to remove portions in which metal lines are to be formed only. The removal of the portions in which the metal lines are to be formed is called as a negative tone patterning. The negative tone patterning of the photoresist film 13 can be conducted in combination of a positive resist and a clear tone mask or a negative resist and a dark tone mask. As shown in FIG. 2b, the patterned photoresist film 13 is used as a mask in etching the second oxide film 12 to form a negative tone structure. As shown in FIG. 2c, the second oxide film 12 is used as a mask in depositing a metal layer 14 of, such as copper Cu, on an entire surface. As shown in FIG. 2d, the metal layer 14 and the second oxide film 12 are planarized to form a metal line layer 14a.

However, the related art method for forming a metal line in a semiconductor device has the following problems.

First, in a case when a negative tone form is formed in a positive photoresist film, it is difficult to remove the photoresist from the via hole or the trench completely by development.

Second, in a case when a negative tone form is formed in a negative photoresist film, a portion which is not exposed is dissolved to make a difference of critical dimensions the greater as a pattern density becomes the greater due to interference of incident lights in formation of a micron pattern. Because of this reason, there has been a limitation in a resolution in formation of the micron pattern and it is difficult to overcome optical proximity and to form a line form of pattern.

SUMMARY OF THE INVENTION

Accordingly, the present invention is directed to a method for forming a metal line in a semiconductor device that substantially obviates one or more of the problems due to limitations and disadvantages of the related art.

An object of the present invention is to provide a method for forming a metal line in a semiconductor device, in which a resolution is improved for securing a design rule and minimizing a difference of critical dimensions.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for forming a metal line in a semiconductor device includes the steps of (1) forming a first insulating film and a second insulating film on a substrate, (2) etching the second insulating film to form a second insulating film pattern, (3) depositing a third insulating film on the second insulating film pattern, (4) removing the second insulating film pattern, and (5) forming a metal line layer in a region having the second insulating film pattern removed therefrom.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings. FIGS. 3a~3g illustrate sections showing the steps of a method for forming a metal line in a semiconductor device in accordance with a preferred embodiment of the present invention, and FIGS. 4a and 4b respectively illustrate a graph and experimental data showing a comparison of a critical dimension difference of an isolated region and a concentrated region for different pattern critical dimensions in the related art and the present invention.

In the present invention, a dual damascene process is employed in which a positive tone form of photoresist film is formed and a nitride film is formed between the photoresist film and the oxide film as a sacrificial layer. The formation of a positive tone form of photoresist film implies that a metal line to be formed later will have the same form as the positive tone form. Therefore, if a negative tone form is formed, it implies that a metal line to be formed later will have a form opposite to the negative tone form.

Figure 1A:
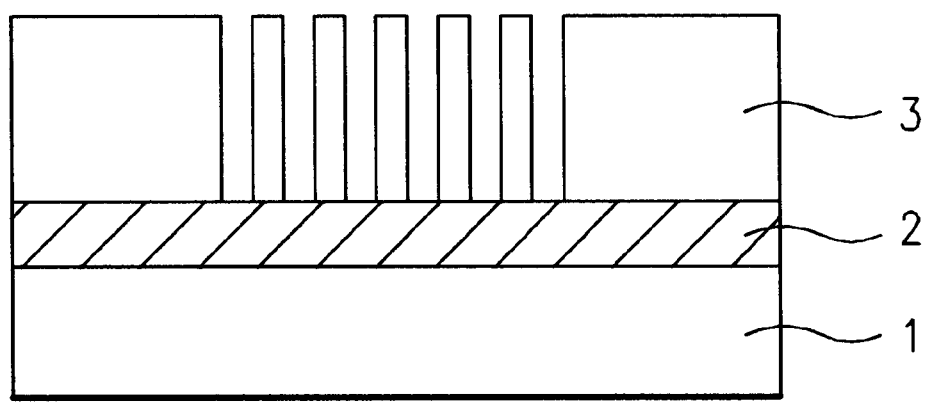
FIGS. 1a and 1b illustrate sections showing the steps of a general method for forming a metal line in a semiconductor device.
Figure 1B:
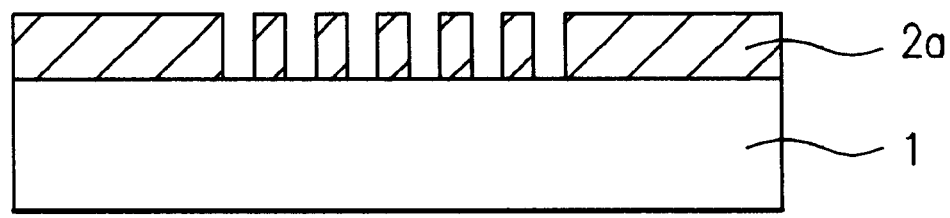
Figure 2A:
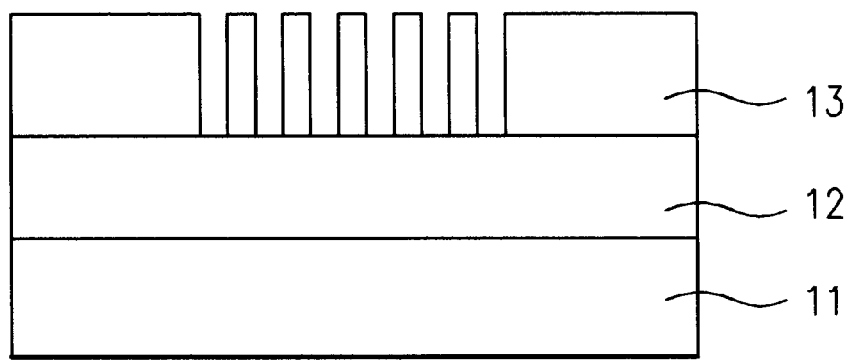
FIGS. 2a~2d illustrate sections showing the steps of a related art method for forming a metal line in a semiconductor device.
Figure 2B:
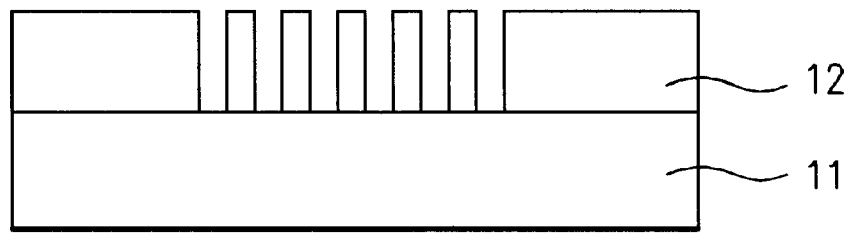
Figure 2C:
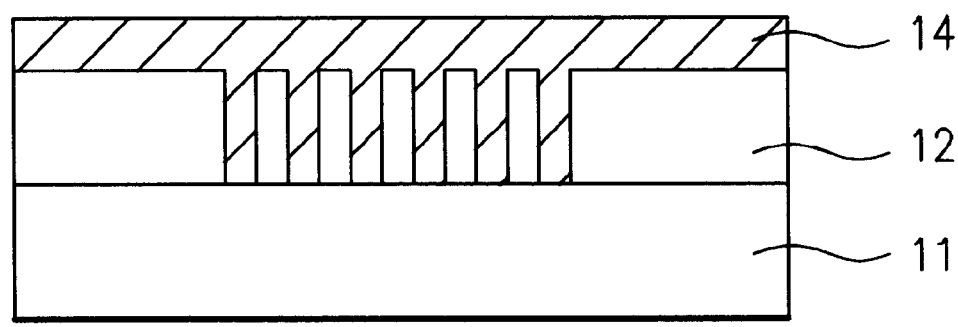
Figure 2D:
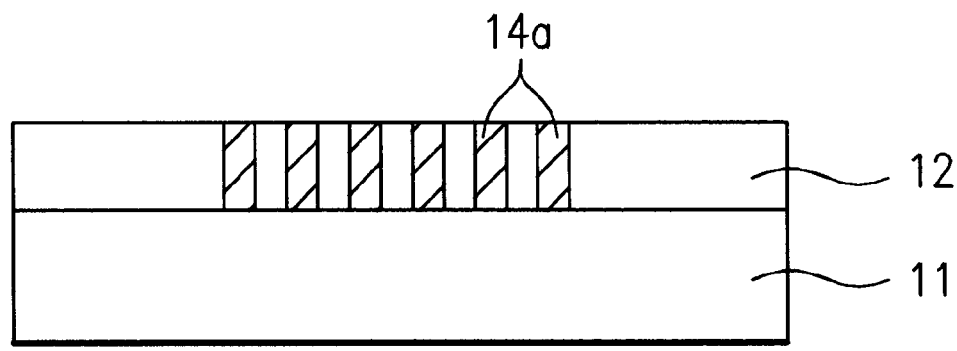
Figure 3A:
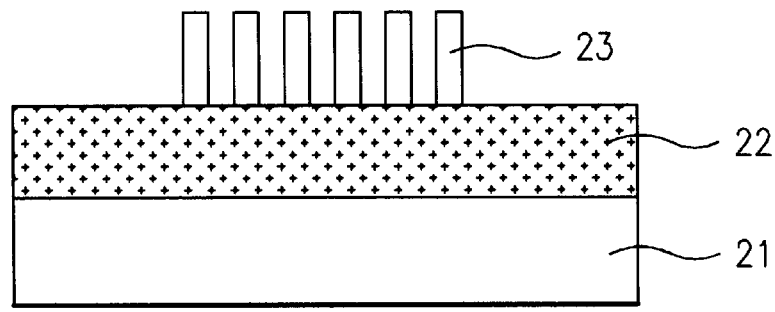
FIGS. 3a~3g illustrate sections showing the steps of a method for forming a metal line in a semiconductor device in accordance with a preferred embodiment of the present invention; and, FIGS. 4a and 4b respectively illustrate a graph and experimental data showing a comparison of a critical dimension difference of an isolated region and a concentrated region for different pattern critical dimensions in the related art and the present invention.
Figure 3B:
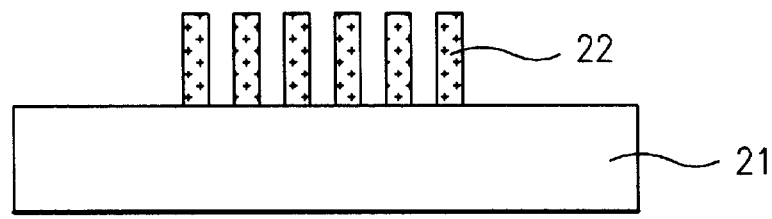
Figure 3C:
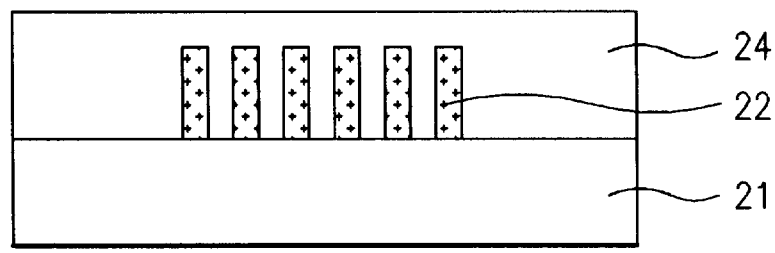
Figure 3D:
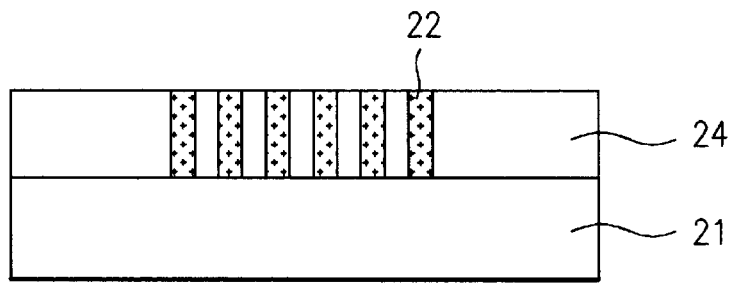
Figure 3E:
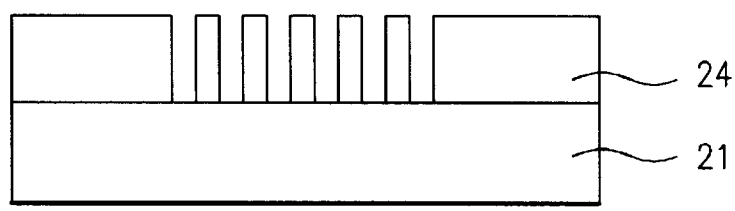
Figure 3F:
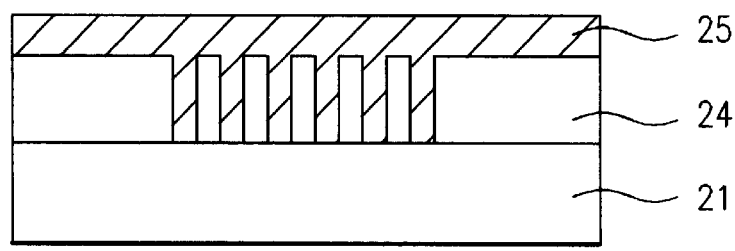
Figure 3G:
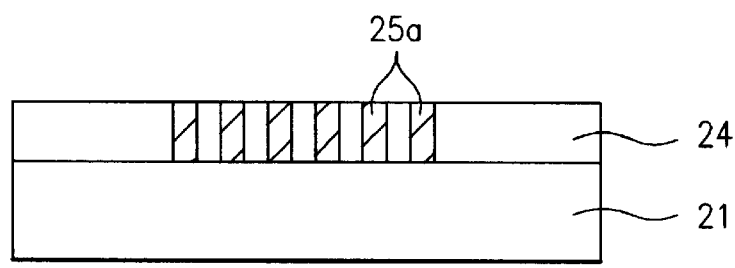

Referring to FIG. 3a, the method for forming a metal line in a semiconductor device in accordance with a preferred embodiment of the present invention starts with deposition of a nitride film 22, which has an excellent selectivity over the first oxide film 21 in a wet etching, on a first oxide film 21. Then, a positive photoresist film 23 is coated on the nitride film 22, and subjected to selective patterning by exposure and development to leave only portions of the photoresist film 23 in which metal lines are to be formed later, to form a positive tone pattern. For reference, the positive photoresist film 23 has such a property that portions of the photoresist that is irradiated during the exposure are removed in development and, opposite to this, the negative photoresist film has such a property that portions of the photoresist that is not irradiated during the exposure are removed in development. As shown in FIG. 3b, the patterned photoresist film 23 is used as a mask in subjecting the nitride film 22 to anisotropic etching to expose the first oxide film 21, to have the nitride film 22 to be of the positive tone form. In order to form the nitride film 22 to be of the positive tone form, either a positive photoresist film and a dark tone mask are combined or a negative photoresist film and a clear tone mask are combined. As shown in FIG. 3c, a second oxide film 24 is deposited on an entire surface to cover the etched nitride film 22. As shown in FIG. 3d, the second oxide film 24 is planarized until the nitride film 22 is exposed. As shown in FIG. 3e, the second oxide film 24 is wet etched with phosphoric acid solution to leave the second oxide film 24 only in portions excluding regions in which metal lines are to be formed. In this instance, the nitride film 22 formed in the via hole in the first oxide film 21 is removed on the same time. Then, as shown in FIG. 3f, a metal layer 25 is deposited on an entire surface. As shown in FIG. 3g, the metal layer 25 and the second oxide film 24 are subjected to CMP(chemical mechanical polishing) or etch back, to planarize the metal layer 25 and the second oxide film 24, to form metal lines 25a. By repeating the aforementioned process, multilayered metal lines can be formed.

Figure 4A:
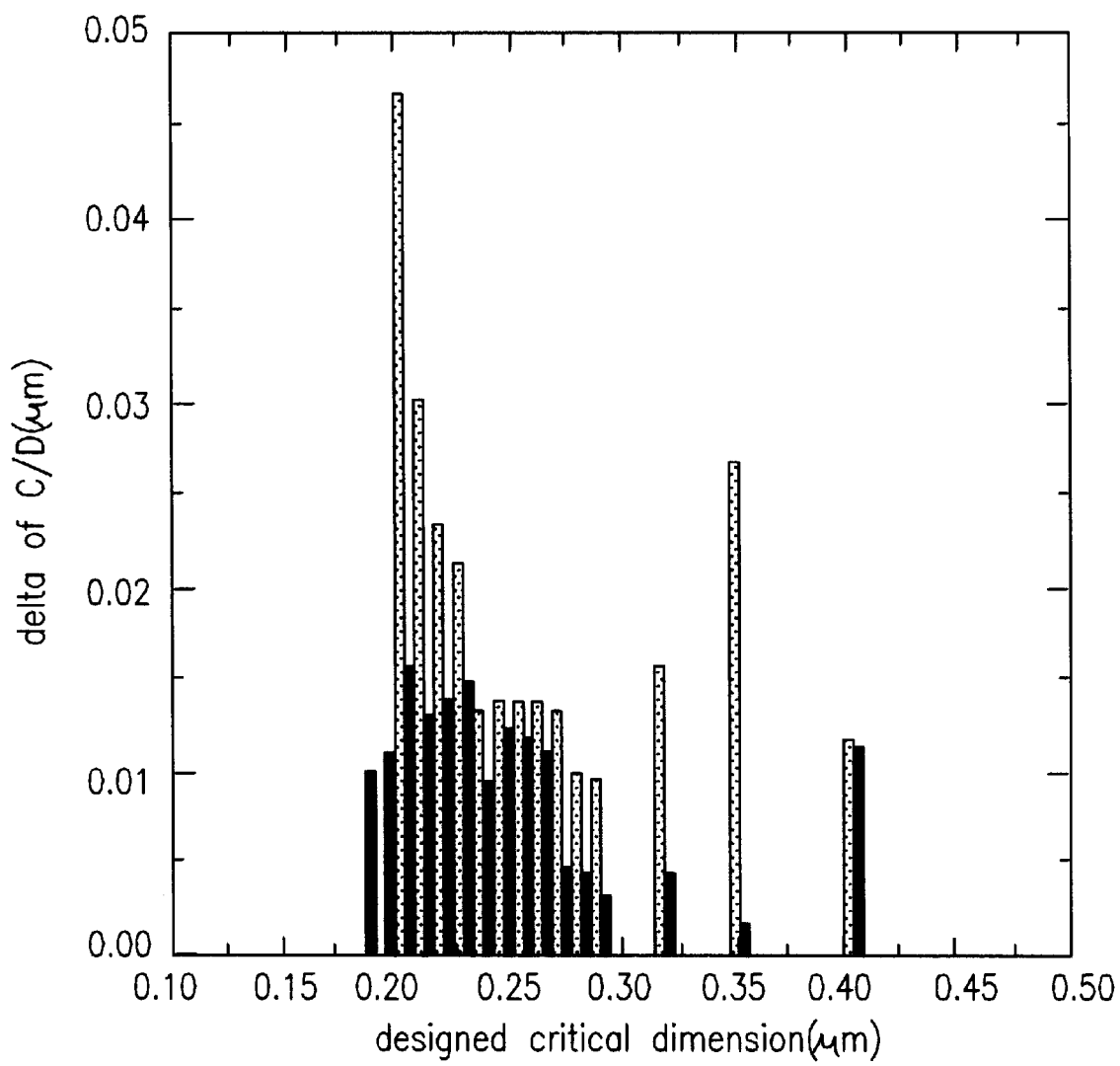

Difference of critical dimensions(c/d) between isolated regions and concentrated regions with respect to designed critical dimensions in the present invention and the related art will be explained referring to FIGS. 4a and 4b. FIG. 4a illustrates a difference of process performances of the negative tone patterning and the positive tone patterning. The present invention employs the positive tone patterning and the related art employs the negative tone patterning. The black colored bars represent the positive tone patterning case and the dotted bars represent the negative tone patterning case. When delta of c/d between the concentration pattern and the isolated pattern for each size is compared, it can be known that in general the delta of c/d between the concentration pattern and the isolated pattern in the case the positive tone patterning is employed is smaller than the case the negative tone patterning is employed. Particularly, as the size of the critical dimension becomes the smaller, as the delta of c/d between the concentration pattern and the isolated pattern in the case the positive tone patterning is employed becomes the smaller than the case the negative tone patterning is employed significantly, it can be known that the positive tone patterning improves the resolution.

Critical dimensions which are limitations of resolutions and differences of the critical dimensions of the positive tone pattern form and the negative tone pattern form in concentrated region and isolated region are compared with reference to drawing. Under the same exposure conditions, a critical value of line/space, a limitation of the resolution, is 0.17 $\mu$m/0. 17 $\mu$m both for the positive tone patterning and the negative patterning done in a concentrated region. Opposite to this, under the same exposure, though a critical value of an isolated line dimension, a limitation of the resolution, is 0.17 $\mu$m for a positive tone patterning in an isolated region, a critical dimension of an isolated space, a limitation of the resolution, is 0.21 $\mu$m for a negative tone patterning in an isolated region. And, though a positive tone pattern form shows a difference of bias less than 0.02 $\mu$m for forming the critical dimension for both in a concentrated region and an isolated region, a negative tone pattern form shows a difference of bias less than 0.051 $\mu$m for forming the critical dimension for both in a concentrated region and an isolated region.

The method for forming a metal line in a semiconductor device of the present invention has the following advantages.

First, the improved resolution allows one to secure a design rule with ease.

Second, a difference of critical dimensions as a concentration of pattern becomes higher coming from optical proximity can be minimized.

It will be apparent to those skilled in the art that various modifications and variations can be made in the method for forming a metal line in a semiconductor device of the present invention without departing from the spirit or scope of the invention. Thus, it is intended that the present invention cover the modifications and variations of this invention provided they come within the scope of the appended claims and their equivalents.

What is claimed is:

1. A method for forming individual metal lines in a semiconductor device, comprising the steps of:
   (1) forming a first insulating film and a second insulating film on a substrate;
   (2) etching the second insulating film to form a second insulating film pattern;
   (3) depositing a third insulating film on the second insulating film pattern;
   (4) removing the second insulating film pattern; and
   (5) forming a metal line layer in a region having the second insulating film pattern removed therefrom, wherein the metal line layer is planarized to the third insulating film to form the individual metal lines within the third insulating film.

2. A method as claimed in claim 1, wherein the first and third insulating films are formed of oxide.

3. A method as claimed in claim 1, wherein the second insulating film is formed of nitride.

4. A method as claimed in claim 1, wherein the step (2) includes the steps of:

forming a photoresist film of a positive tone pattern on the second insulating film;

etching the second insulating film using the patterned photoresist film; and removing the photoresist film.

5. A method as claimed in claim 4, wherein, in the step (2), a positive photoresist film and a dark tone mask are employed.

6. A method as claimed in claim 4, wherein, in the step (2), a negative photoresist film and a clear tone mask are employed.

7. A method as claimed in claim 1, wherein the second insulating film pattern is removed by wet etching using phosphoric acid solution.

8. A method as claimed in claim 1, wherein the metal line layer is planarized by chemical mechanical polishing or etch back.

9. A method as claimed in claim 1, wherein the step (3) includes the steps of, depositing the third insulating film on an entire surface including the second insulating film pattern; and, planarizing the third insulating film until a surface of the second insulating film pattern is exposed.

* * * * *